(12) United States Patent
Phan Le et al.

(10) Patent No.: US 8,593,032 B2
(45) Date of Patent: Nov. 26, 2013

(54) FRAME-SHAPED MEMS PIEZORESISTIVE RESONATOR

(75) Inventors: Kim Phan Le, Eindhoven (NL); Jozef T. M. van Beek, Rosmalen (NL)

(73) Assignee: NXP, B.V., Eindhoven (NL)

( * ) Notice: Subject to any disclaimer, the term of this patent is extended or adjusted under 35 U.S.C. 154(b) by 313 days.

(21) Appl. No.: 13/123,719

(22) PCT Filed: Oct. 13, 2009

(86) PCT No.: PCT/IB2009/054504
§ 371 (c)(1),
(2), (4) Date: Apr. 12, 2011

(87) PCT Pub. No.: WO2010/044058
PCT Pub. Date: Apr. 22, 2010

(65) Prior Publication Data
US 2011/0204999 A1    Aug. 25, 2011

(30) Foreign Application Priority Data
Oct. 14, 2008   (EP) .................................... 08166565

(51) Int. Cl.
*H01L 41/107*   (2006.01)
(52) U.S. Cl.
USPC ........................... 310/318; 310/311; 310/314
(58) Field of Classification Search
USPC ......................................... 310/311, 314, 318
See application file for complete search history.

(56) References Cited

U.S. PATENT DOCUMENTS

| | | | |
|---|---|---|---|
| 6,985,051 B2 | 1/2006 | Nguyen et al. | |
| 7,205,867 B2 | 4/2007 | Lutz et al. | |
| 7,323,952 B2 | 1/2008 | Pan et al. | |
| 7,434,476 B2* | 10/2008 | Tang et al. | ...................... 73/777 |
| 7,555,938 B2* | 7/2009 | Bargatin et al. | .............. 73/64.53 |
| 2006/0114541 A1 | 6/2006 | van Beek | |

(Continued)

FOREIGN PATENT DOCUMENTS

| | | |
|---|---|---|
| WO | 2007/036820 A2 | 4/2007 |
| WO | 2007/102130 A2 | 9/2007 |
| WO | 2010/015963 A1 | 2/2010 |

OTHER PUBLICATIONS

Patil, S., et al. "Highly Conducting Doped Poly-Si Deposited by Hot Wire CVD and its Applicability as Gate Material for CMOS Devices", Thin Solid Films 430, vol. 430, pp. 63-66 (Apr. 22, 2003).
Bahreyni, B., et al. "Piezoresistive Sensing with Twin-Beam Structures in Standard MEMS Foundry Processes", Sensors and Actuators A 127, No. 2; pp. 325-331 (Mar. 2006).
van Beek, J., et al. "Scalable 1.1 GHz Fundamental Mode Piezo-Resistive Silicon MEMS Resonator", IEEE Int. Electron Devices Meeting, pp. 411-414 (2007).

(Continued)

*Primary Examiner* — Thomas Dougherty

(57) ABSTRACT

A novel Si MEMS piezoresistive resonator is described. The resonator has a shape of a frame, such as a ring or a polygon frame, which has two or more anchors. Electrodes located at the outer or inner rim of the resonant structure are used to excite the structure electrostatically into resonance with a desired mode shape. One or plurality of locally doped regions on the structure is used for piezoresistive readout of the signal. In the most preferred embodiments, the structure is a ring, which has four anchors, two electrodes and four piezoresistive regions at different segments of the structure. The piezoresistive regions are alternatively located at the outer rim and inner rim of the structure in such a way that the piezoresistive signals of the same sign from different regions can be collected. Advantages of this device are large readout signal, large electrode area, robustness, suppressed out-of-plane vibration and larger usable linear range.

12 Claims, 13 Drawing Sheets

(56) References Cited

U.S. PATENT DOCUMENTS

| | | | |
|---|---|---|---|
| 2007/0046398 | A1 | 3/2007 | Nguyen et al. |
| 2007/0070821 | A1 | 3/2007 | Weigold |
| 2011/0193449 | A1* | 8/2011 | Phan Le et al. ............... 310/317 |
| 2012/0032747 | A1* | 2/2012 | Vermeeren et al. ............ 331/154 |
| 2012/0276462 | A1* | 11/2012 | Ishida et al. .................. 429/413 |

OTHER PUBLICATIONS

Jiao, J., et al. "Doubly Clamped Nanobeam as a Piezoresistive Mass Sensor", IEEE Sensors 2007 Conference, pp. 1168-1171 (Oct. 2007).

International Search Report and Written Opinion for Int'l. Patent Application No. PCT/IB2009/054504 (Feb. 4, 2010).

* cited by examiner

FRAME-SHAPED MEMS PIEZORESISTIVE RESONATOR

FIELD OF THE INVENTION

The present invention relates to a piezo frame resonator.

BACKGROUND OF THE INVENTION

MEMS resonators are being intensively studied in many research groups and some first products have recently been released. This type of device offers a high Q-factor, small size, high level of integration and potentially low cost. These devices are expected to replace bulky quartz crystals in high-precision oscillators and may also be used as RF filters. The oscillators are widely used in time-keeping and frequency reference applications such as RF modules in mobile phones, devices containing blue-tooth modules and other digital and telecommunication devices.

Microelectromechanical systems (MEMS) are the technology of the very small, and merge at the nano-scale into nano-electromechanical systems (NEMS) and nanotechnology. MEMS are also referred to as micromachines (in Japan), or Micro Systems Technology—MST (in Europe). MEMS are separate and distinct from the hypothetical vision of Molecular nanotechnology or Molecular Electronics. MEMS are made up of components between 1 to 100 µm in size (i.e. 0.001 to 0.1 mm) and MEMS devices generally range in size from a 20 µm to a millimeter. They usually consist of a central unit that processes data, the microprocessor and several components that interact with the outside such as microsensors. At these size scales, the standard constructs of classical physics do not always hold true. Due to MEMS' large surface area to volume ratio, surface effects such as electrostatics and wetting dominate volume effects such as inertia or thermal mass.

There are several ways to excite and to readout the mechanical vibration of a resonator. In most MEMS resonators, excitation is done by electrostatic actuation and readout is done by capacitive or piezoresistive method. In some cases, the actuation can be done by the piezoelectric or thermal expansion.

A piezoresistive readout principle is e.g. described in US20060114541 A1, "Transducer and electronic device"; WO2007036820 A3, "OSCILLATOR BASED ON PIEZORESISTIVE RESONATORS"; and in J. T. M van Beek et al., "Scalable 1.1 GHz fundamental mode piezoresistive silicon MEMS resonator", IEDM, Int. Electron Devices Mtg., 2007, ID81339050 "Cantilever piezoresistive silicon resonator".

Various patent documents disclose MEMS resonators.

Frame shaped MEMS resonators are described in U.S. Pat. No. 7,205,867 and U.S. Pat. No. 6,985,051, different embodiments such as squares, polygons, and rings are shown in these documents. U.S. Pat. No. 7,205,867 mentions the use of piezoresistive elements as electrodes.

A MEMS resonator is shown in US20070046398 where the resonator is shaped as a filled circle with 2 anchors on opposite sides and 4 electrodes on opposite sides to each other.

U.S. Pat. No. 7,323,952 and US20070070821 show MEMS resonators that are ring shaped with inner and outer surface. In U.S. Pat. No. 7,323,952 is it specifically mentioned that the piezoresistive elements can be used for implementing the resonator according to the invention.

The above disclosures mainly focus on the mechanical construction, such as shape, anchors etc, and mode shapes of the resonators. The driving principle is electrostatic and the sense principle is capacitive.

In the following two main prior-art piezoresistive resonator types are described.

1) Piezoresistive Free-Free Beam Resonator

The layout of the free-free beam resonator is shown in FIG. 1 (also described in the first and third references mentioned above). It consists of a free-free beam structure made of Si, which is free at the two ends and anchored at the middle point. The beam has a slit in the middle to direct the sense current. To actuate the device two electrodes are placed at the two free ends. The electrodes are separated from the vibrating structure by two transduction gaps. During operation a combination of AC and DC voltages is applied to the electrodes to drive the structure into resonance. The vibration mode of the structure is the longitudinal bulk-mode (marked by the double-headed arrows in the figure). To sense the vibration (signal readout) the whole Si structure is doped (either n- or p-type) and during operation a sense current is sent through the beam via the anchors (see the arrows in the figure). Due to the piezoresistive effect, the resistance of the beams is changing with the strain induced in the beam when it is vibrating. This readout principle has been proved by experiments to give a few orders of magnitude higher signal than that of the conventional capacitive readout principle.

2) Piezoresistive Dog-Bone Resonator

This is a variation of the piezoresistive free-free beam resonator. Due to the fact that the transconductance (i.e. the signal) of the device scales with the electrode area (i.e. the height times the length of the electrodes), the free-free beam design is modified into the so-called dog-bone design. The dog-bone design consists of two big heads, connected by two arms. The anchors remain at the middle. There is also a slit in the middle of the arms in order to direct the readout current to the two arms. The area of the electrodes, now being the height times the width of the heads, in this device is many times larger than that of the free-free beam design.

The main advantages of the above resonators are very large piezoresistive signal, scalability to high frequency (especially the free-free beam design), less sensitive to gap width, not sensitive to structure height, and a high quality factor. However, during experimenting with these devices a problem is encountered, namely that at relatively large vibration amplitudes they can easily vibrate in some out-of-plane mode shapes, besides the intended in-plane mode shape. FIG. 3 shows an optical observation of a bird-wing out-of-plane mode-shape of a dog-bone resonator operated at relatively high amplitude. The appearance of the parasitic out-of-plane mode shapes leads to a number of negative consequences:

Energy is shared between the modes, that means less energy is stored in the intended in-plane mode. Consequently the efficiency of the device is reduced.

At large vibration amplitudes the signal is not stable and there exist so-called beating patterns in the signal (see an example in FIG. 4). These phenomena are due to complicated couplings between in-plane and out-of-plane vibration modes. The instability in the signal can occur even at lower actuation force at which the bifurcation appears.

As a result, the usable linear range of a device is reduced. The usable linear range is defined as the maximum actuation force below which a linear and stable signal can still be obtained.

The above resonators, such as piezoresistive free beam/lever/dog-bone resonators, can easily vibrate in out-of-plane mode shapes at relatively large vibration amplitudes. This leads to a number of negative effects, such as reduction of efficiency, instability and nonlinearity.

The present invention is aimed at solving one or more of the above mentioned problems and problems associated with the prior art resonators, without jeopardizing other desired characteristics.

SUMMARY OF THE INVENTION

The present invention relates to a MEMS piezoresistive resonator, preferably a silicon resonator, wherein the resonator has the form of a frame, preferably a circular form or polygonal form, such as square, rectangular, hexagonal, octagonal, decagonal, comprising two or more anchors, and one or more electrodes for exciting the resonator, wherein the resistivity of resonator material is at least one first location relatively high and/or wherein the resistivity of resonator material is at least one second location relatively low, a method of operating said MEMS resonator, a method of minimizing energy loss in said MEMS resonator, and a device comprising said resonator.

Advantages of this device are large readout signal, large electrode area, robustness, suppressed out-of-plane vibration and larger usable linear range. The readout signal is more than 10 times larger than for capacitive readout, typically more than 100 times larger than for capacitive readout, such as more than 500 times larger. The electrode area is in fact virtually not limited, especially when electrodes are placed both at the outer rim and inner rim of the resonator. The robustness, e.g. in terms of stiffness, is very large and allows for very high amplitudes of the resonator. It is noted that the present resonator operates in e.g. elliptic mode shape. Compared to e.g. a dog-bone configuration the out-of-plane vibration is largely suppressed. Compared to e.g. a dog-bone configuration the usable linear range is at least five times higher, e.g. a dog-bone has a linear behavior at Vdc up to about 25V, whereas the present configuration has a linear behavior at Vdc up to about 130V or higher.

It has been found, after thorough research, that the appearance of the out-of-plane vibration in the above prior art devices is mainly due to the fact that most of the designs consist of large or long resonant structure which is hung by only two small anchors, and due to that the anchors are not evenly distributed around the structure.

In the present invention, improved piezoresistive resonators are provided which use two or more anchors at evenly distributed locations on the vibrating structure. It has been proved by experiments that these resonators have a very stable signal and a larger usable working range, while still keeping the readout signal (trans conductance) and the Q-factor high. It is noted that in contrast to some of the above disclosure the resonators may be piezoresistive.

Thus, compared to the prior-art devices as described above, the present frame resonators are operated in the flexural mode, instead of prior art bulk mode. The present resonators have generally more anchors positioned at evenly distributed locations, and as a consequence are therefore more robust, giving more stable signal and having larger linear range.

Further, the present resonators offer the following advantages:

A large output signal due to the piezoresistive readout.

Optionally a larger electrode area.

Out-of-plane modes are suppressed, consequently resulting in more robust resonators, giving a more stable signal and a larger working range.

Therefore, the present device is a candidate to replace the traditional quartz crystal in electronic oscillators, which are at present used for time referencing applications such as in GSM devices, bluetooth, and many other RF circuits. The present device can also be used in any type of resonant sensors, such as strain sensors, biosensors, etc. that use mechanical resonance as a detection method.

DETAILED DESCRIPTION OF THE INVENTION

In a first aspect the present invention relates to a MEMS piezoresistive resonator, preferably a silicon resonator, wherein the resonator has the form of a frame, preferably a circular form or polygonal form, such as square, rectangular, hexagonal, octagonal, decagonal, comprising two or more anchors, and one or more electrodes for exciting the resonator, wherein the resistivity of resonator material is at at least one first location relatively high and/or wherein the resistivity of resonator material is at least one second location relatively low.

The term MEMS may in principal also refer to NEMS.

In a preferred embodiment the resonator is a silicon or silicon germanium resonator, or more general a material that can easily be incorporated into a process of manufacturing, such as a CMOS process.

The resonator comprises two or more anchor points, which anchor points preferably function as nodal points or quasi nodal points, as well as points by which the resonator is attached to the surrounding structure, such as the substrate. These nodal points experience little or no movement during operation, that is are substantially stationary during oscillation of the resonator structure. As there is a need to send a current through the frame, always two or more anchors are required. From the mechanical point of view, the frame (or ring) will vibrate if there is one anchor at a nodal point, but this design is only possible if the signal is detected by capacitance change.

The resonator further comprises electrodes. The device will properly operate if there is one electrode, provided that this electrode is located at an anti-nodal point, that is the "belly" of the standing wave of the intended mode shape where the vibration amplitude is maximal. Of course, in order to increase the transduction efficiency alpha (the efficiency of converting the input signal to the output signal) of the device it is preferred to increase the length of the electrode, c, as seen in Eq(3a). Having more number of electrodes also means increasing c. Preferably, the present device comprises two or more electrodes. The electrodes are typically formed of a conductor. The electrodes may be placed inside the frame, or outside the frame, or a combination thereof. It is noted that the electrodes preferably do not form part of the MEMS structure and are as such a separate structure, separated from the MEMS by e.g. an air gap, a different material, etc. The electrode is electrically isolated from the MEMS body.

A first and a second electrode may be interconnected.

The resistivity of resonator material is relatively high and/or relatively low at certain locations. The term "resistivity" refers to the electrical resistivity of a material (also known as specific electrical resistance) and is used in its normal meaning. Thus when e.g. referring to (relatively pure) silicon the resistivity ($\Omega$-m) at 20° C. is $6.40 \times 10^2$.

Below are some examples of doping concentration and resistivity of silicon:

Starting material: lowly doped Si wafers: typical concentration of $10^{14}/cm^3$, resistivity of 10-100 Ohm·cm. Then, during a fabrication process, Si can be doped further (for instance locally doped), to reach a lower resistivity, such as:

| Concentration (/cm³) | Resistivity (Ohm · cm) |
|---|---|
| $7.8 \times 10^{16}$ | 0.1 |
| $4.5 \times 10^{18}$ | 0.01 |

A relatively high resistivity then refers to a value close to 100 Ω-cm, such as larger than 50 Ω-cm, preferably larger than 10 Ω-cm, whereas a relatively low resistivity then refers to a value below 1.0 Ω-cm, such as smaller than 0.5 Ω-cm, preferably smaller than 0.1 Ω-cm A high resistivity are is e.g. an undoped area, a low resistivity area is e.g. a piezoresistive area. There may preferably still be a third area which has very low resistivity for electrical connection. These areas typically have the following characteristics:

Un-doped Si, high resistivity: from 14-22 Ohm-cm, the higher the better (even higher ohmic wafers of ~100 Ohm-cm can be provided).

low-dope, low resistivity (serving as the piezoresistive region): 0.1 Ohm-cm.

high-dope, very low resistivity (serving as the connection): 0.01 Ohm-cm.

It is clear that the levels above do not have to be exactly as described. They can be doped differently, provided that there are sufficiently large differences between the 3 doping levels, e.g. by a factor 2 difference.

The proposed Si MEMS resonator has a shape of a ring, or a symmetrical polygon frame, such as a square frame. It is noted that within the meaning of the present invention the frame forms a ring structure, being a polygon, or a circle. Typical dimensions of such a ring structure are a diameter of 1-500 µm, preferably 5-200 µm, more preferably 10-100 µm, such as 50 µm, a width of 0.1-100 µm, preferably 1-50 µm, more preferably 2-20 µm, such as 10 µm, wherein L (see below) is from 0.2-200 µm, preferably 1-100 µm, more preferably 2-50 µm, such as 30 µm, wherein c (see below) is from 0.1-200 µm, preferably 0.5-100 µm, more preferably 1-50 µm, such as 20 µm, and wherein e (see below) is from 0.05-100 µm, preferably 0.25-50 µm, more preferably 0.5-25 µm, such as 5 µm. The thickness of the ring structure is typically from 0.05-100 µm, preferably 0.25-50 µm, more preferably 0.5-25 µm, such as 1-10 µm, e.g. 1.5-5 µm.

The resonator typically operates, depending on dimensions, in a range from 1 MHz-10 Ghz, such as a typical frequency for prior, present and future wireless applications, respectively.

The structure has, among others, an in-plane mode shape in which segments of the structure alternatively bend inward and outward, while the width of the structure substantially remains unchanged. Anchors are positioned at the quasi-nodal points of the mode shape, i.e. at the boundaries between the segments. A number of electrodes are position at the outer rim and/or inner rim of the structure at appropriate positions in order to excite the structure into mechanical resonance at the desired mode shape. At one or more locations on the structure, the Si material is locally doped (n- or p-type) to enable the piezoresistive effect. The piezoresistive regions are connected together and connected to the outside world via the anchors by highly doped regions, or regions coated with metal layers. The connections are made in such a way that during vibration, the piezoresistive signal, being the change in resistance as a function of strain in the doped Si material, at different piezoresistive regions can be added up. During operation, a current is sent via the anchors, through the different piezoresistive regions to collect the piezoresistive signal. This signal is proportional to the deformation of the structure during its vibration. Applying a combination of AC and DC voltages on the electrodes excites the vibration.

The present resonators provide flexural vibration modes, in contrast to e.g. prior art bulk modes, such as wine glass mode.

Typically the current goes in and out through the two or more anchors. In a preferred embodiment the present MEMS piezoresistive resonator comprises four anchor points, preferably located symmetrically.

In a further preferred embodiment the present MEMS piezoresistive resonator has resonator material that is locally N- and/or P-type doped.

Typical implantation species are one or more of P, As, B, $BF_2$ and In, at e.g. a respective energy range of 5-60 keV, 10-300 keV, 1-60 keV, 1-20 keV and 30-600 keV, at a respective dose of $1.10^{13}$-$1.10^{15}$, $1.10^{12}$-$1.10^{16}$, $1.10^{13}$-$1.10^{16}$, $1.10^{13}$-$1.10^{16}$, and $1.10^{13}$-$1.10^{15}$ cm².

With the term "lowly doped" a typical concentration of $1.10^{13}$-$1.10^{14}$ cm$^{-2}$ is meant. With the term "highly doped" a typical concentration of $1.10^{14}$-$1.10^{16}$ cm² is meant.

An advantage of such a local doped region it that it enables piezoresistive readout. A disadvantage of such doping is that it involves at least one extra mask step.

In a further preferred embodiment the present MEMS piezoresistive resonator is divided by anchor points into n symmetrical elements, wherein n is an even integer, preferably n is 2, 4, 6, 8 or 10, most preferably n is 4. As such n sections can be defined. Each section may comprise an electrode, or alternating sections may comprise an electrode, or only two electrodes may be present, or combinations thereof. The electrodes may be positioned inside or outside the frame of the resonator, or combinations thereof.

Each section can be defined to have an outer circumferial length of L, each electrode can be defined to have an inner circumferial length of c, and each doped section can be defined to have an average circumferial length of e and a width of s. Below it is explained how to optimize the relative length L, c, e and width s. Such optimized lengths and width provide a preferred embodiment according to the invention.

In a further preferred embodiment the present MEMS piezoresistive resonator has in the vicinity of an anchor point a resistivity of resonator material that is locally relatively low and/or wherein in a first area between anchor points the resistivity of resonator material is relatively high and/or wherein in a second area between anchor points the resonator material is piezoresistive, such as lowly doped with n- or p-type material, or vice versa.

In a second aspect the present invention relates to a method of operating a MEMS piezoresistive resonator according to the invention, by applying a combination of AC and DC excitation voltages. Thereto a bias-T circuit is used, comprising an AC input and a DC input, both coupled and connected to an input electrode. Preferably an output electrode is coupled to an amplifier, wherein the amplifier is connected to the bias-T circuit. When used in an oscillation circuit, the total phase of the open circuit loop, i.e. the amplifier connected in series with the resonator should be approximately 0°, preferably substantially equal to 0°. Further, the total amplification factor β of the circuit comprising the electrodes, bias-T circuit, amplifier and present MEMS, is larger or equal than 1.

In a preferred embodiment the present method relates to a resonator that is operated to vibrate in a flexural mode shape, or more precisely in an elliptic mode shape.

In a further preferred embodiment the present method during operation relates to alternating segments of the resonator contracting and extending at a certain point in time.

In a third aspect the present invention relates to a method of minimizing vibration energy loss by operating a resonator according to the invention.

In a fourth aspect the present invention relates to a device, such as a time referencing application, such as a GSM device, a bluetooth device, a RF circuit, a resonant sensor, such as a strain sensor, a biosensor, and a sensor using mechanical resonance, comprising a MEMS piezoresistive resonator according to the invention.

In a fifth aspect the present invention relates to a method of maximizing transduction efficiency K in a MEMS piezoresistive resonator, by maximizing Q-factor, s (width of piezoresistive region), L (length of one segment) and $\beta_0$ and minimizing g (transconductance) and W (width of resonator ring).

The present invention is further elucidated by the following figures and examples, which are not intended to limit the scope of the invention. The person skilled in the art will understand that various embodiments may be combined.

DETAILED DESCRIPTION OF THE DRAWINGS

Embodiment 1

Figure 1:
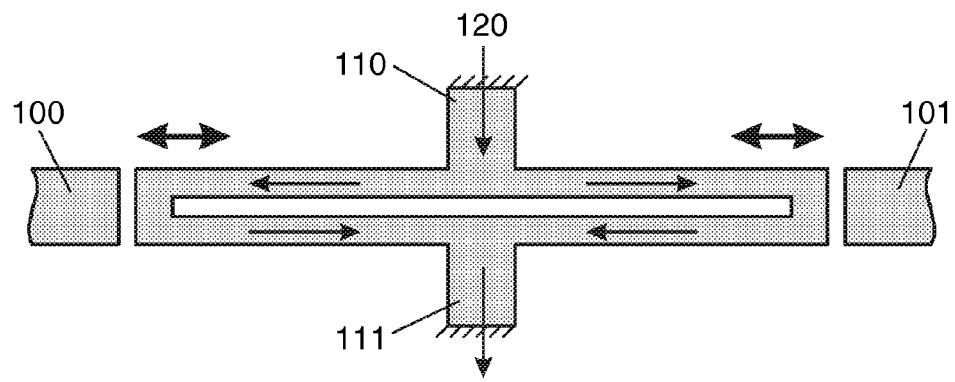
FIG. 1. Principle of the piezoresistive free-free beam resonator (prior-art).
Figure 2:
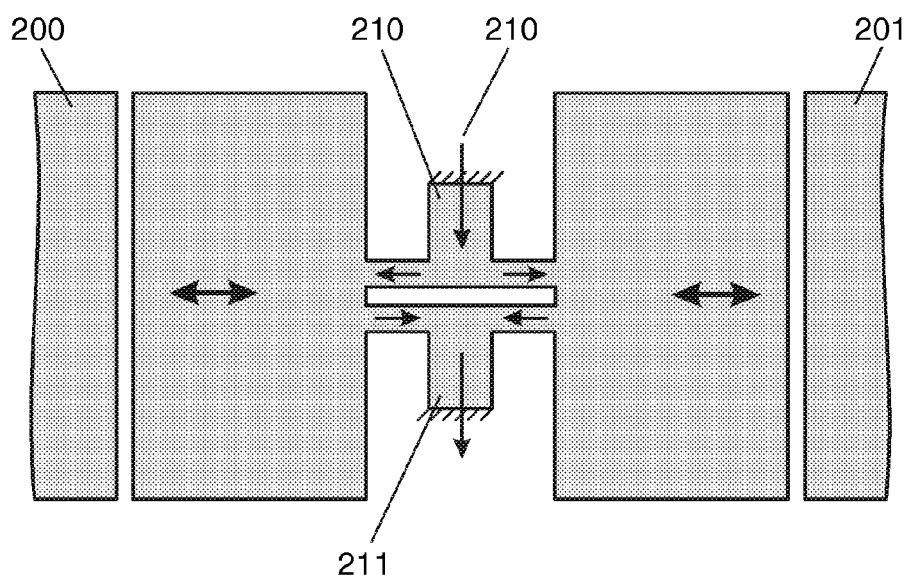
FIG. 2. Principle of the piezoresistive dog-bone resonator (prior-art).
Figure 3:
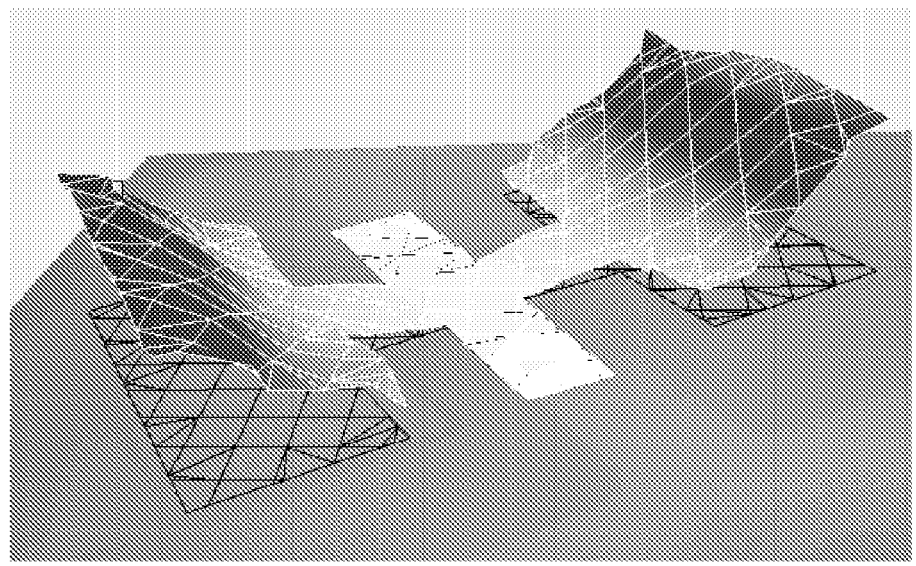
FIG. 3. Laser vibrometer measurement of a dog-bone resonator showing a large out-of-plane vibration mode besides the intended in-plane vibration mode.
Figure 4:
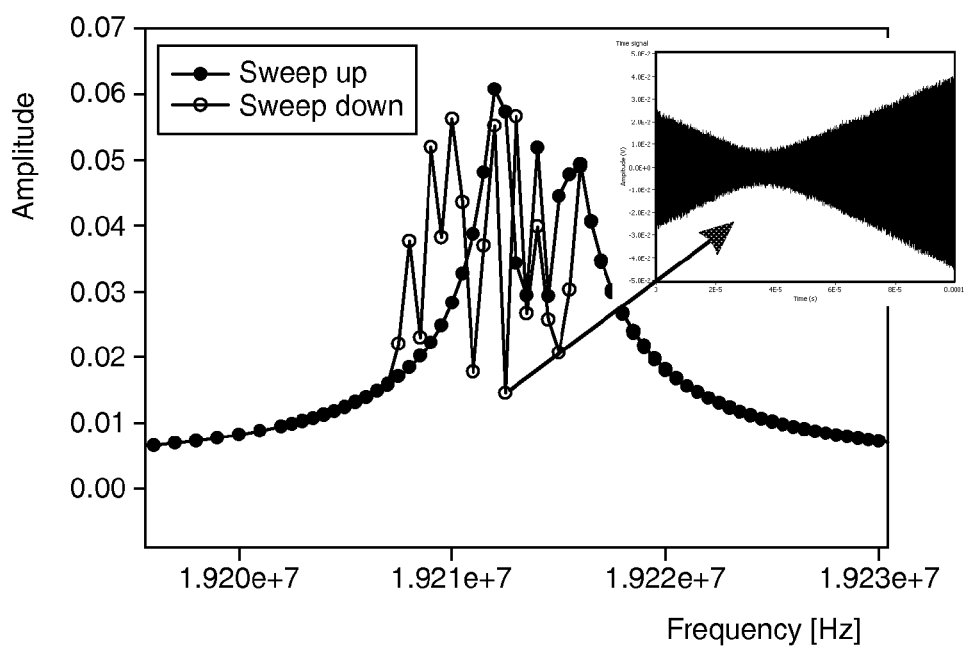
FIG. 4. Frequency response curve of a dog-bone resonator showing the instability and beating pattern in the signal.
Figure 5A:
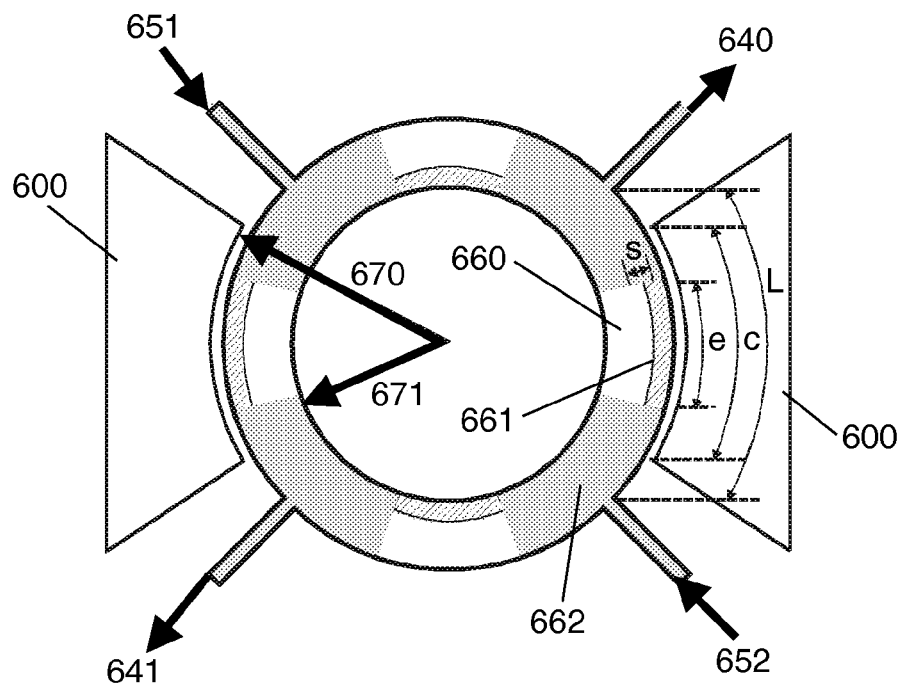
FIG. 5. A most preferred embodiment, as well as rectangular alternatives.

In a most preferred embodiment, the proposed resonator consists of a ring which is anchored at four symmetrical points, see FIG. 5a. There are two electrodes placing close to the outer rim, at two opposite segments.

Figures 5B, 5C:
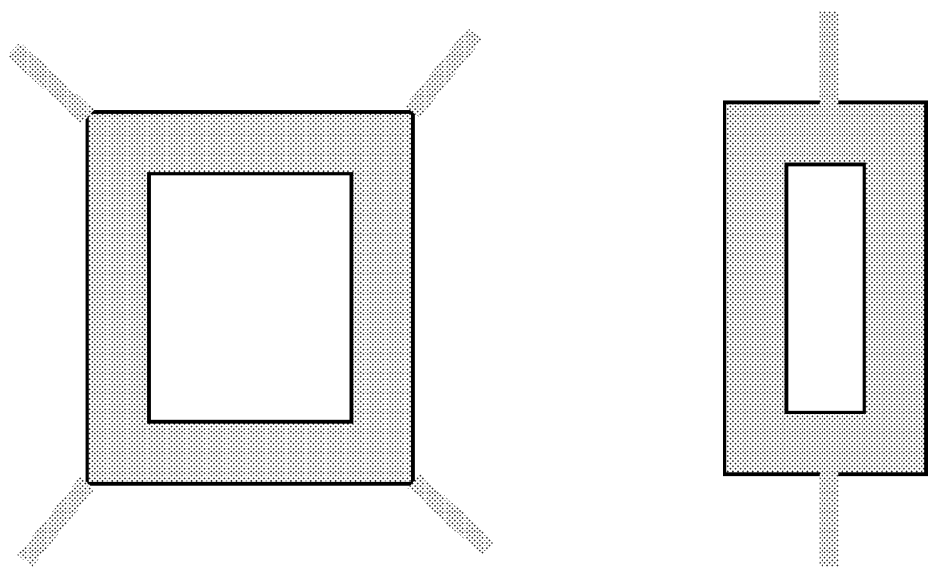

In a second most preferred embodiment, the proposed resonator consists of a rectangle, preferably a square, which is anchored at four symmetrical points, see FIG. 5b.

In a third most preferred embodiment, the proposed resonator consists of a rectangle, which is anchored at two symmetrical points, see FIG. 5c.

Figure 6:
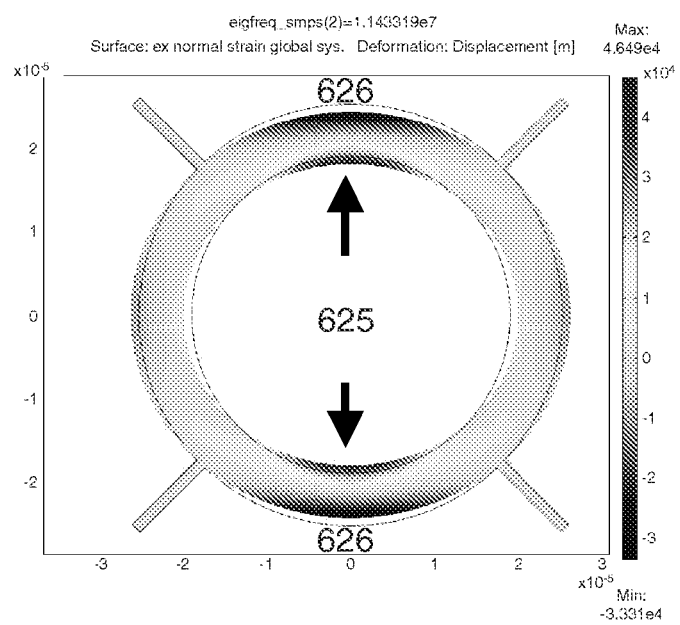
FIG. 6. Finite element simulation showing the in-plane elliptic mode shape.
Figure 6:
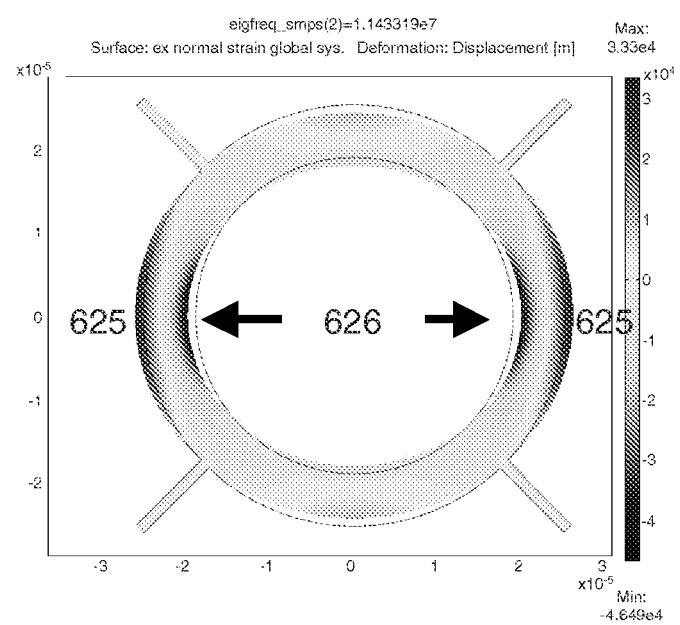

If a combination of AC and DC excitation voltages is applied on the electrodes, the ring will vibrate in the elliptic mode shape, see FIG. 6, in which the segments of the ring between the anchors alternatively flex inward and outward. The anchors are positions at the nodes of the mode shape at which the structure only slightly rotates, but not significantly displaces. With this arrangement the vibration energy loss through the anchors is minimized.

The upper and lower pictures of FIG. 6 shows maps of strain in the X, and Y directions, respectively. The sections (625) relate to expansion, and the –sections (626) to contraction. One can easily recognize that at every segment of the ring, the outer rim and the inner rim have opposite strain signs and the strain sign alternates from one segment to the next. For instance, the outer rim of the upper segment contracts while the inner rim of the same segment extends. At the same time, outer rim of the right segment (i.e. the neighbor segment) extends while its inner rim contracts, and so on.

To collect the piezoresistive signals due to strain induced in the structure, four regions are locally doped with a suitable doping concentration (normally it is a relatively low concentration), as seen in FIG. 5. In the present ring, these regions are preferably doped lowly because their resistivity is preferably smaller than the areas of short connection (the regions in between the piezoresistive regions). These regions, hereafter called the piezoresistive regions, should exhibit good piezoresistive effect. The piezoresistive regions are located at every segment of the ring and alternatively at the inner and outer rim, where the magnitudes of strain are maximum. The arrangement of the piezoresistive regions should be such that during vibration, they undergo strain with the same sign. The areas in between the piezoresistive regions are doped with high concentration to make the material low ohmic. These low ohmic regions also extend to the anchors and from the anchors to the outside world. The low ohmic regions serve as the electrical connections between the piezoresistive regions and from these regions to the outside world. These low ohmic regions therefore have no significant contribution to the piezoresistive signal. The rest of the ring area should be left undoped, thus having very high resistance. During operation, a sense current is sent through two opposite anchors and going out through the other two opposite anchors. In this configuration the four piezoresistive regions are connected in parallel and the sign of change in signals in all resistors are the same, thus the signals can be added up. The total piezoresistive signal change can be used as the output signal of the resonator, the same as in the prior-arts presented in section "Background of the invention".

Model and Optimization of the Device

Since the ring has four identical segments and the vibration of the segments are symmetrical, that means they flex with the same magnitude; only the phase of consecutive segments area reversed, we can model one segment of the ring and use it to describe the other segments.

Figure 7:
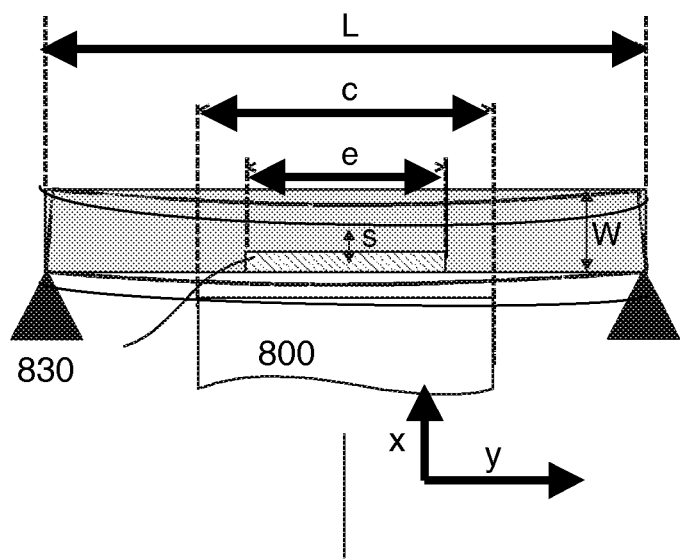
FIG. 7. Simplified model to describe deflection of a segment of the ring.

The deflection of one segment of the ring can be modeled as a simply supported straight beam, see FIG. 7.

In FIG. 7 the length of the segment, the length of the electrode and the length of the piezoresistive regions are denoted as L, c and e, respectively; s is the distance from the center of the beam to the center of the piezoresistive region in the x direction, and W is the beam width.

During vibration, the beam (or in reality, the segment of the ring) displaces in the x direction, that causes bending stress in the beam and consequently strain e in the y direction. This strain is responsible for the piezoresistive signal. The averaged strain in the y direction induced within the piezoresistive region, $\bar{\epsilon}$, can be described as a function of the averaged x-displacement of beam section facing the electrode, $\bar{x}_c$ and the geometry of the beam:

$$\bar{\epsilon} = \frac{\bar{x}_c}{l_{eq}}; \tag{1}$$

with the equivalent piezoresistive length:

$$l_{eq} = \frac{\frac{5L^3}{16} - \frac{Lc^2}{8} + \frac{c^4}{80L}}{\left(3L - \frac{e^2}{L}\right)s} \tag{2}$$

in which $l_{eq}$ is the equivalent piezoresistive length of a dog-bone resonator that gives the same strain-displacement relationship. Note that the equivalent length used in the ring resonator has only the mathematical meaning, in order to compare to the model for the dog-bone resonator.

In the dog-bone resonator, this length is the real length of the beam and the displacement x is in the same direction as the strain of the beam.

The transconductance, $g_m$, of the resonator can be expressed as a complex Lorentzian function of frequency:

$$g_m = \frac{2\varepsilon_0 chK}{g^2 l_{eq} k_{eff}} I_d V_g \frac{1}{1 - \frac{\omega^2}{\omega_0^2} + j\frac{\omega}{\omega_0 Q}}; \tag{3}$$

in which: $\epsilon_0$ is the permittivity of space=8.854 10$^{-12}$ F/m, h is the height of the device, K is the piezoresistive gauge factor (dimensionless), g is the transduction gap width, $k_{eff}$ is the effective spring stiffness of the resonator, $I_d$ is the total current sent through the device, $V_g$ is the DC bias voltage applied on the electrodes, $\omega$ is the frequency of the AC voltage applied on the electrodes, $\omega_0$ is the resonant frequency of the resonator and Q is the quality factor.

The maximum transconductance, $g_{m\text{-}max}$, is obtained when the resonator is at the resonant frequency, i.e. $\omega = \omega_0$ $$g_{m\text{-}max} = \frac{2\varepsilon_0 chKQ}{g^2 l_{eq} k_{eff}} I_d V_g = \alpha I_d V_g; \tag{3a}$$

in which $\alpha$ is the transduction efficiency. The larger the transduction efficiency, the more signal one can get with the same input energy. It should be noted that, compared to the dog-bone or the free-free beam resonator, the electrode area of the ring resonator can be multiplied by the number of electrodes, in this case, by two. This is because the dog-bone and the free-free beam resonators can be modeled as two separated back-to-back resonators, each having one electrode, while the ring resonator should be modeled as one single resonant structure which is actuated by both two electrodes.

The resonant frequency of the ring resonator can be written as:

$$\omega_0 = \frac{2\sqrt{3}}{3} \frac{m(m^2-1)}{\sqrt{m^2+1}} \frac{(R_{out} - R_{in})}{(R_{out} + R_{in})^2} \sqrt{\frac{E}{\rho}} \tag{4}$$

in which m is the mode shape number (for the elliptic mode, m=2); $R_{out}$ and $R_{in}$ are the outer and the inner radii of the ring; therefore we have the width of the ring $W = R_{out} - R_{in}$.

For the elliptic mode shape, m=2, the resonant frequency, the effective mass, $m_{eff}$ and the effective spring stiffness, $k_{eff}$, are:

$$\omega_0 = \frac{4\sqrt{3}}{\sqrt{5}} \frac{R_{out} - R_{in}}{(R_{out} + R_{in})^2} \sqrt{\frac{E}{\rho}} \tag{5}$$

$$m_{eff} = \frac{1}{2}\rho h\pi(R_{out}^2 - R_{in}^2) \tag{6}$$

$$k_{eff} = \frac{24}{5}\pi Eh\left(\frac{R_{out} - R_{in}}{R_{out} + R_{in}}\right)^3 \tag{7}$$

The length of one segment, L, can be considered the length measured at the middle of the ring width, i.e.:

$$L = \frac{\pi}{4}(R_{out} + R_{in}) \tag{8}$$

Combining (7) and (8) with (3) we obtain the expression for the transduction efficiency:

$$\alpha = \frac{80\varepsilon_0 KQ}{3\pi^4 Eg^2} \frac{sL^2 \beta_0}{W^3}; \tag{9}$$

with: $\beta_0 = \dfrac{c_0(3 - e_0^2)}{\left(\dfrac{5}{16} - \dfrac{c_0^2}{8} + \dfrac{c_0^4}{80}\right)}$ and $c_0 = c/L$;

$e_0 = e/L; 0 \le e_0 \le 1; 0 \le e_0 \le 1$

Figure 8:
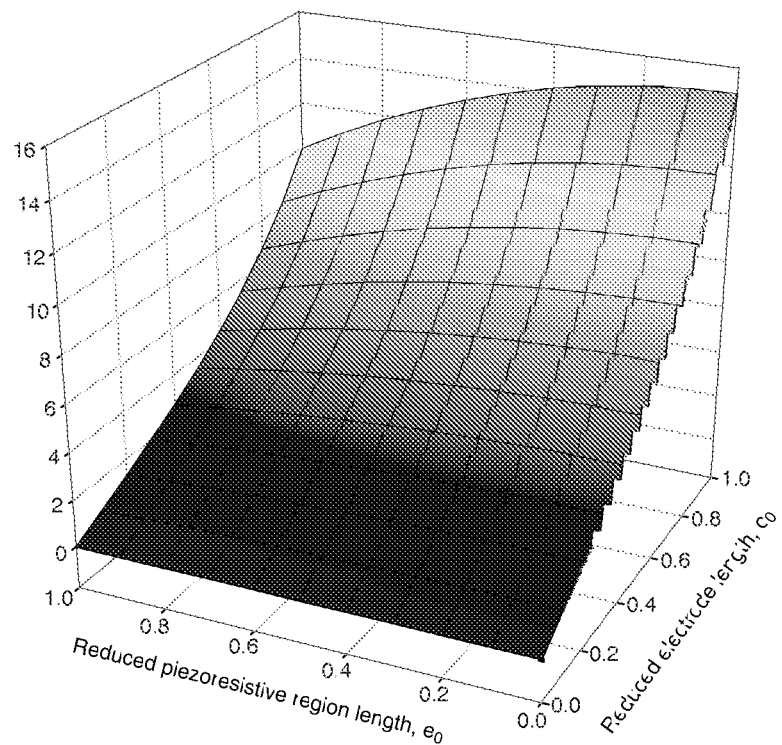
FIG. 8. Dimensionless parameter $\beta_0$ as a function of reduced electrode length $c_0$ and piezoresistive region length $e_0$.

To maximize the transduction efficiency, K, Q, s, L and $\beta_0$ should be maximized while g and W should be minimized. Of course the relation between L and W will determine the resonant frequency, so can not be freely chosen. However from this relation we can say that the lower the frequency (small W and large L) the larger the efficiency is. The dimensionless parameter $\beta_0$, which is a function of both reduced electrode length $e_e$ and piezoresistive region length $e_0$, is plotted in FIG. 8.

To maximize $\beta_0$, $e_e$ should be as small as possible and $e_0$ should be as large as possible. The change in $e_0$ has a larger effect than that of $e_e$.

In spite of the fact that the ring resonator has more anchors and operated in the flexural mode, compared to the prior-arts, for instance the bulk-mode dog-bone resonators, the ring resonator can still offer the same good Q factor and comparable transduction efficiency. The equivalent length of the ring resonator is generally longer than the dog-bone resonator, which in principle results in smaller α. However, to compensate for, the ring resonator has generally much lower spring stiffness and the double electrode area (since both electrodes contribute to drive the same resonant structure). This is the reason for the equally good transduction efficiency, as compared to the dog-bone resonators. The high Q factor in the ring resonator can be achieved since the anchors are positions at the vibration nodes where only little displacement occurs.

Figure 9A:
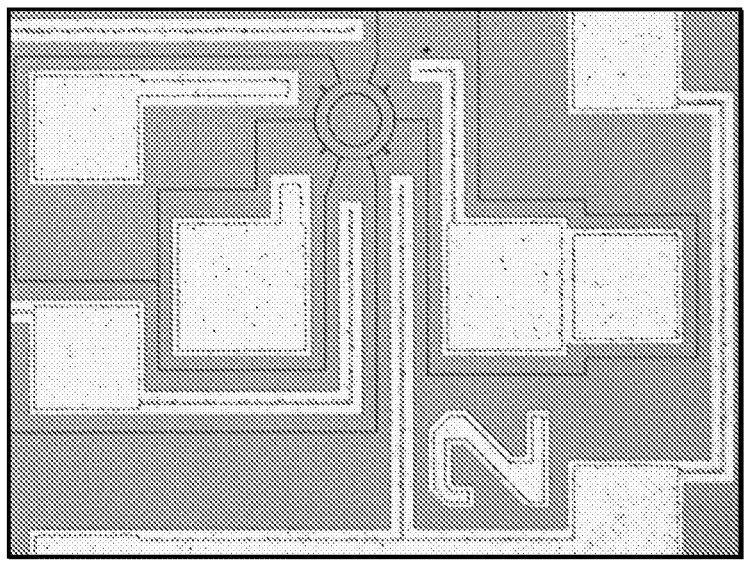
FIG. 9a. Microscope image of a ring resonator according to the preferred embodiment.
Figure 9B:
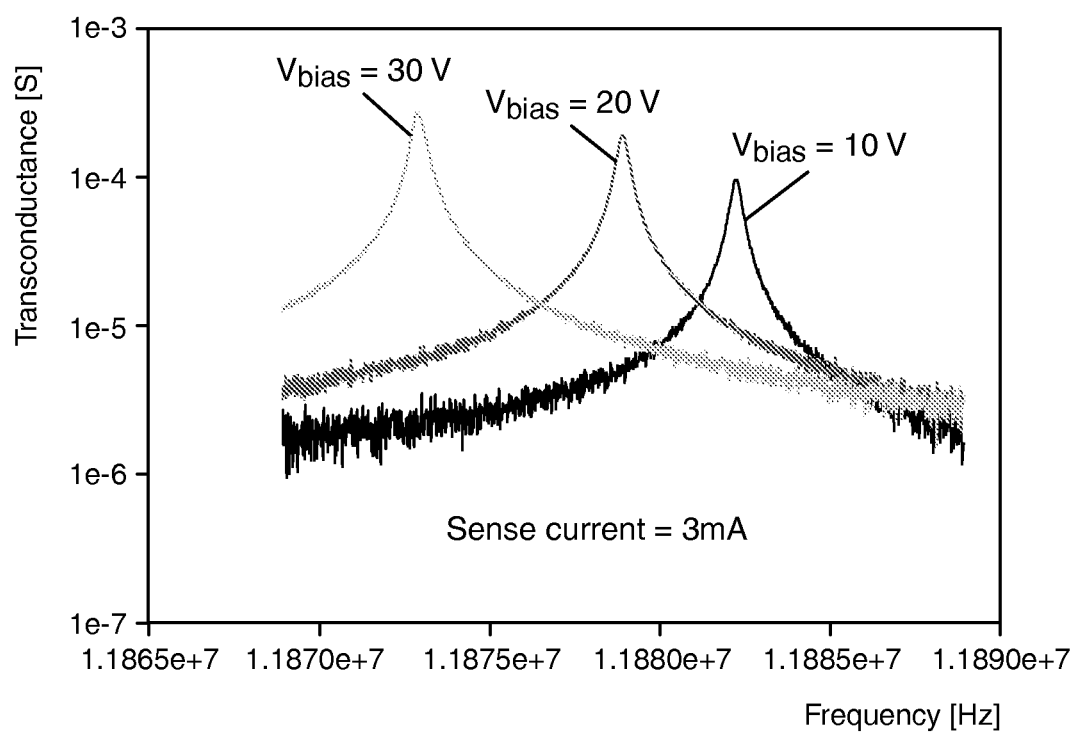
FIG. 9b. Transconductance $g_m$, as a function of frequency, measured at a fixed sense current of 3 mA and various DC bias voltages across the transduction gaps.
Figure 9C:
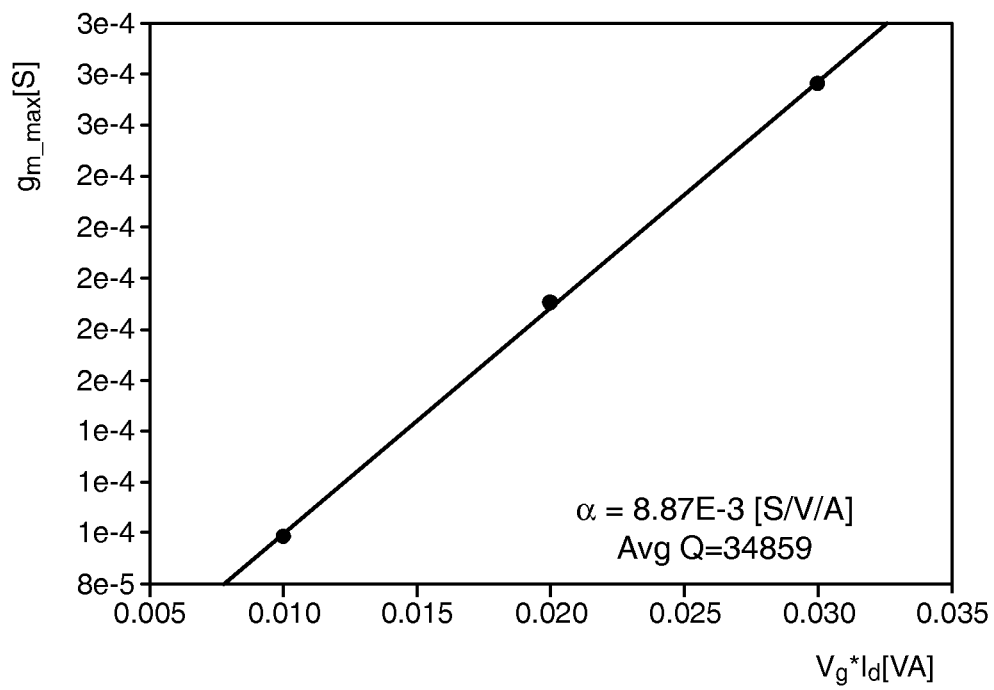
FIG. 9c. Maxima of the transconductance curves, $g_{m\text{-}max}$, of the plots in FIG. 9b, as a function of the product $V_g * I_d$.

Samples of the ring-shaped resonator have been realized and tested. FIG. 9a shows a microscope image of a fabricated device. FIG. 9b shows measured trans conductance $g_m$ as a function of frequency, at different DC bias voltages. FIG. 9c shows a plot of $g_{m-max}$ as a function of $V_g*I_d$. This relation is linear, as predicted by (3a). The slope of this curve is the transduction efficiency α, which is 8.9E-3 [S/V/A] for this device. Substituting realistic dimensions and other device parameters into the model results in a of $9.810^{-3}$ [S/V/A].

In the following, other embodiments will be given. The embodiments can be classified into 5 categories:

Readout configuration: this includes positions and arrangements of the piezoresistive regions and the way to connect them and signal readout schemes.

Electrode configuration: number and positions of the electrodes.

Anchor configuration: number, positions and shapes of the anchors.

Shape of the resonant structure.

Resonant mode shape.

It should be noted that the embodiments as given below are just examples; all mixtures of different embodiments are possible.

Embodiment 2

Readout Configuration

Figure 10:
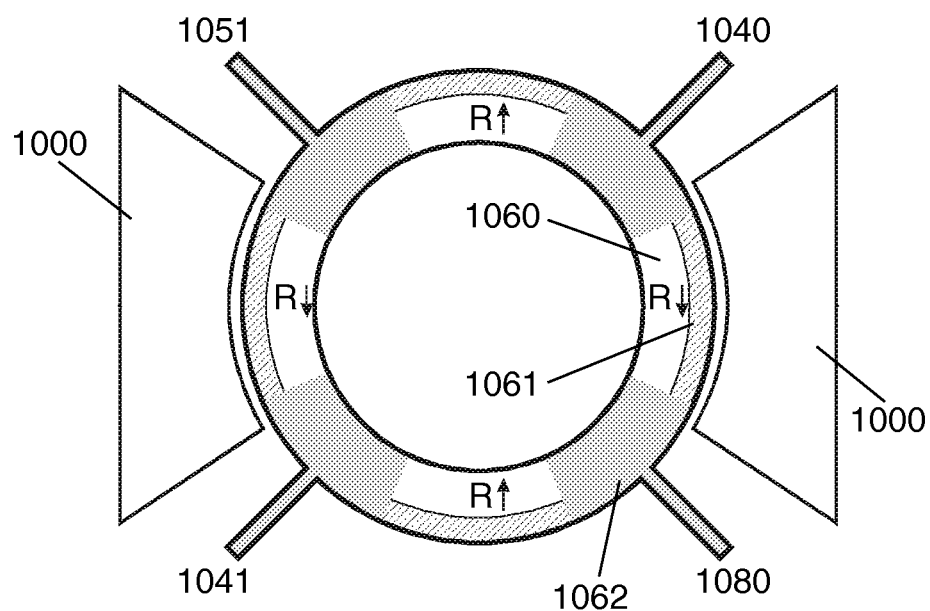
FIG. 10. Ring resonator with the Wheatstone bridge configuration.

Because we have 4 anchors and many possibilities to choose the locations of the piezoresistive regions with both negative and positive strain, there can be many possible readout configurations. For instance, in FIG. 10, a Wheatstone bridge configuration is shown. The piezoresistive regions are all located at the outer rim (or alternatively they are all at the inner rim). During any half vibration cycle, the piezoresistive signal alternates from one segment to the next, due to the alternating strain signs, as shown by R↑ and R↓ in the figure. If a DC voltage is applied in between two opposite anchors, the output voltage signal can be obtained from the other two anchors. Due to the Wheatstone bridge configuration, the signal change is doubled, as compared to the normal configuration.

Different doping types can also be implemented within the same resonant structure. The sign of the piezoresistive gauge factor depends on the dope type: it is negative for n-type and positive for p-type. Therefore, besides choosing the location of the piezoresistive region, different dope types can also be used to set the sign of the piezoresistive signal.

Embodiment 3

Electrode Configuration

Figure 11:
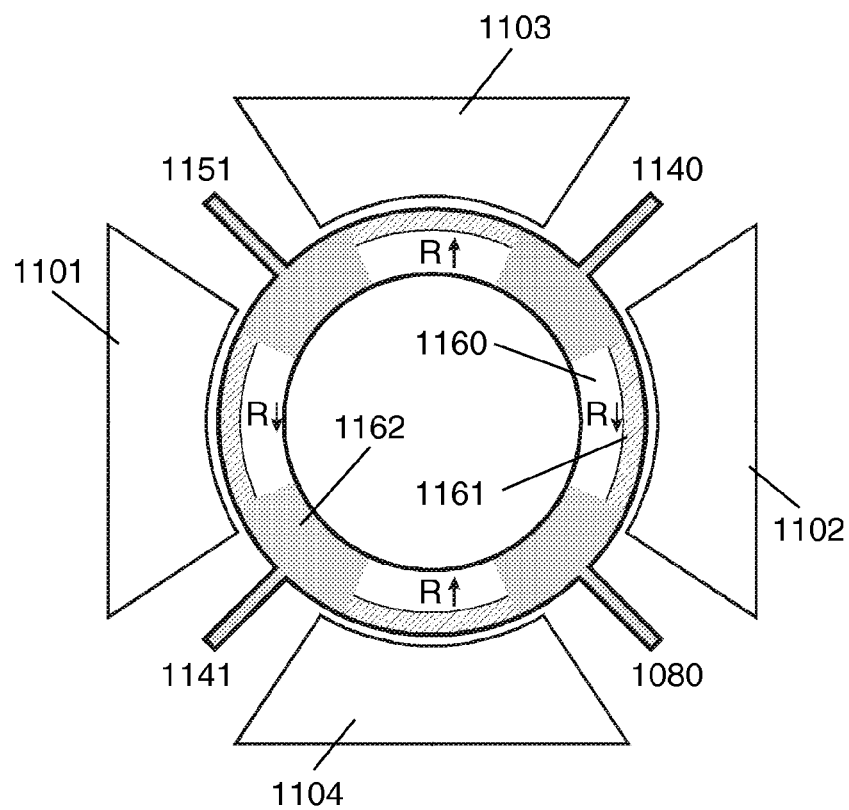
FIG. 11. Four-electrode configuration.

To maximize the electrode area, thus maximizing the transduction efficiency, four electrodes on all four segments of the ring can be used (FIG. 11). To drive the resonator correctly, AC driving voltage on the other two electrodes (e.g. electrodes 1103 and 1104) should be in anti-phase with the first two electrodes (electrodes 1101 and 1102).

Even it is not desired, a configuration with only one electrode is also possible.

Figure 12A:
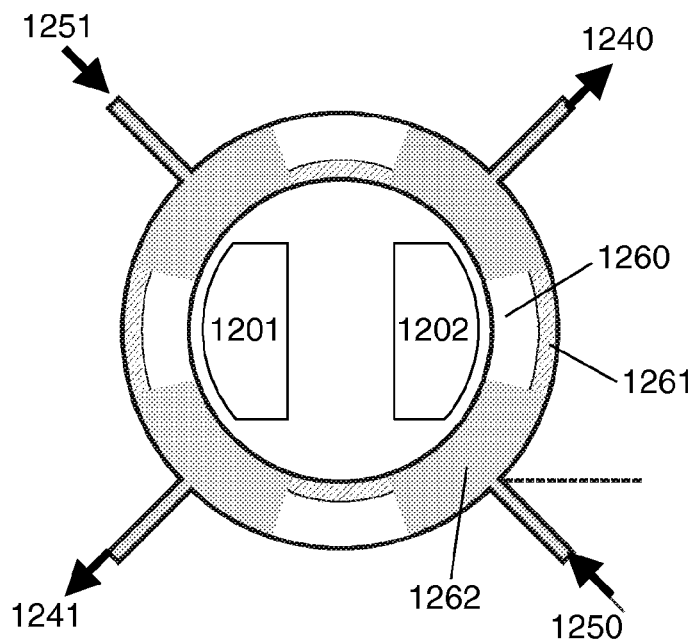
FIG. 12a. Electrodes located at the inner side of the structure.

Instead of having the electrodes at the outer rim of the structure, the electrodes (1201, 1202 or more electrodes) can also be placed at the inner rim of the structure, for example as illustrated in FIG. 12a.

Figure 12B:
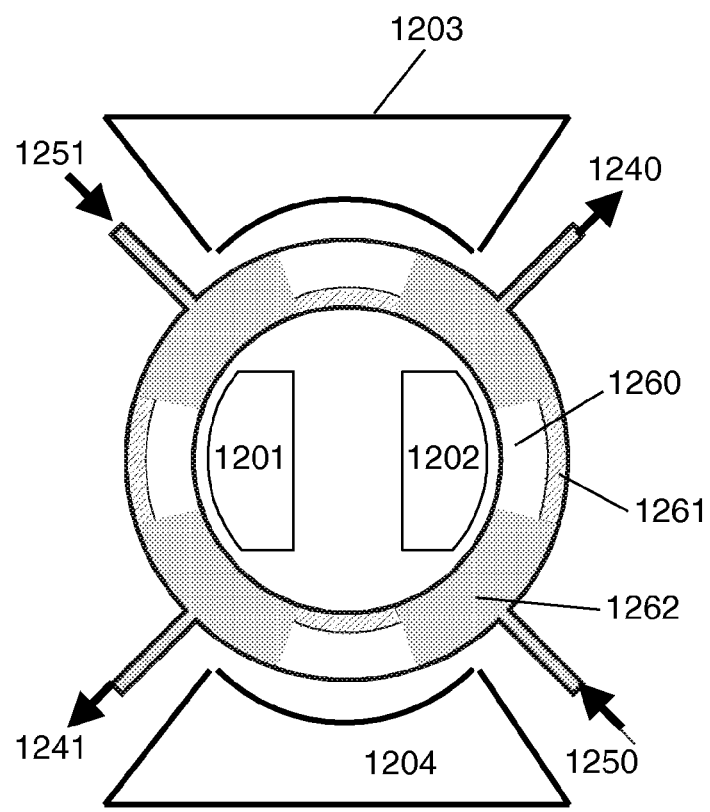
FIG. 12b. Electrodes located at the inner and outer side of the structure.

Electrodes can also be placed inside and outside the ring, as shown in FIG. 12 b. In this configuration all electrodes are connected together (having in-phase electrical voltages). So in a half of an excitation cycle, electrodes 1201 and 1202 pull the west and east segments inwards whereas electrodes 1203 and 1204 pull the north and south segment outwards. This is exactly the intended mode shape of operation.

Embodiment 4

Anchor Configuration

Figure 13:
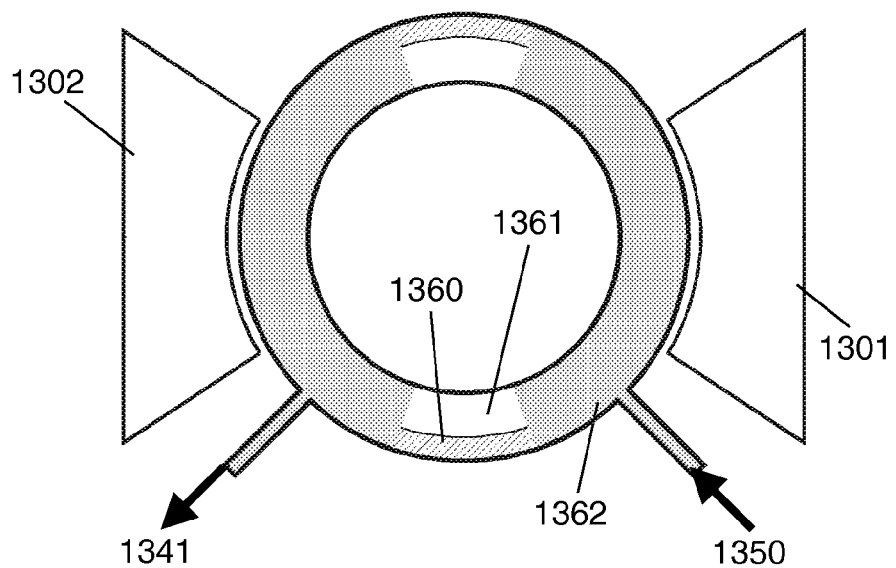
FIG. 13. Two-anchor configuration.

The elliptical mode shape can still be defined correctly if less than 4 anchors are used. For instance in FIG. 13, a ring resonator with only two anchors is shown. It is important that the positions of the anchors are still at the nodes of the intended mode shape, and the positions of the electrodes are at the anti-nodes of the same mode shape. The readout configuration shown in this picture is just an example, where a current flows from one anchor, splitting into two parallel routes, and going out via the other anchor. Because in this configuration the energy loss through the anchors are less than that of the 4-anchor configuration, the Q-factor is expected to be higher.

In principle the structure can still resonate with only one anchor, that would be optimum for high Q device. However in this case the piezoresistive readout cannot be deployed; only capacitive readout is possible.

The anchors can have different shapes, besides the straight bar shape as shown above. For instance, the anchors can have L-shape, T-shape or meander shape, etc.

Figure 14:
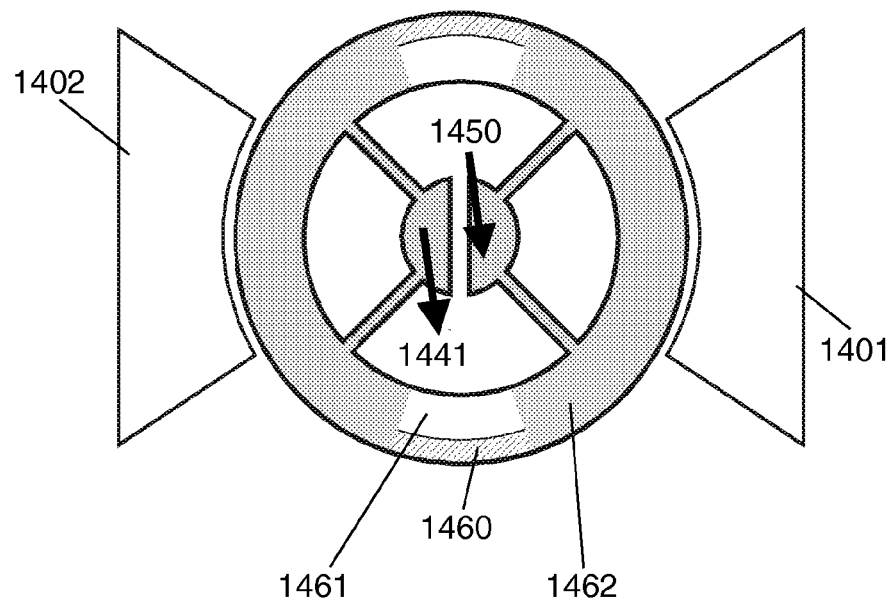
FIG. 14. The anchors can point inward.

Instead of pointing outward, the anchors can also point inward, as shown in FIG. 14.

Embodiment 5

Shape of Resonant Structure

Figure 15:
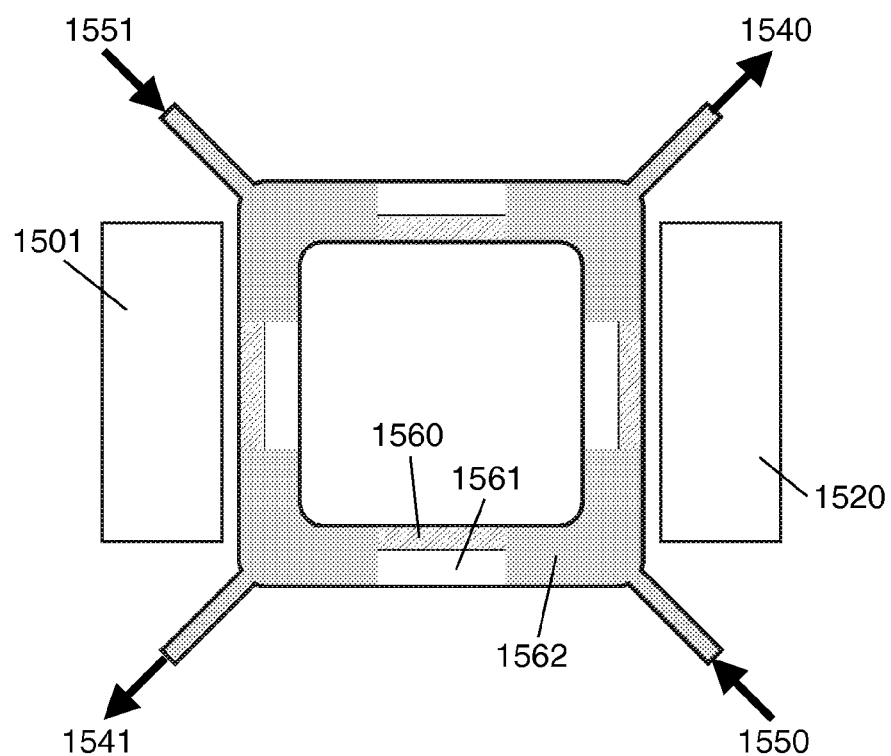
FIG. 15. Resonant structure having a shape of a square frame.

Besides the ring structure, the shape of the resonant structure can be any symmetrical polygon frame having an even number of edges. For instance, FIG. 15 shows a square frame, in which the four edges resemble the four segments of the ring. The operation and mode shape of this device are very much the same as the ring resonator. To make a correct closed standing wave within the structure, the number of polygon edges should be even.

Embodiment 6

Resonant Mode Shape

Figure 16:
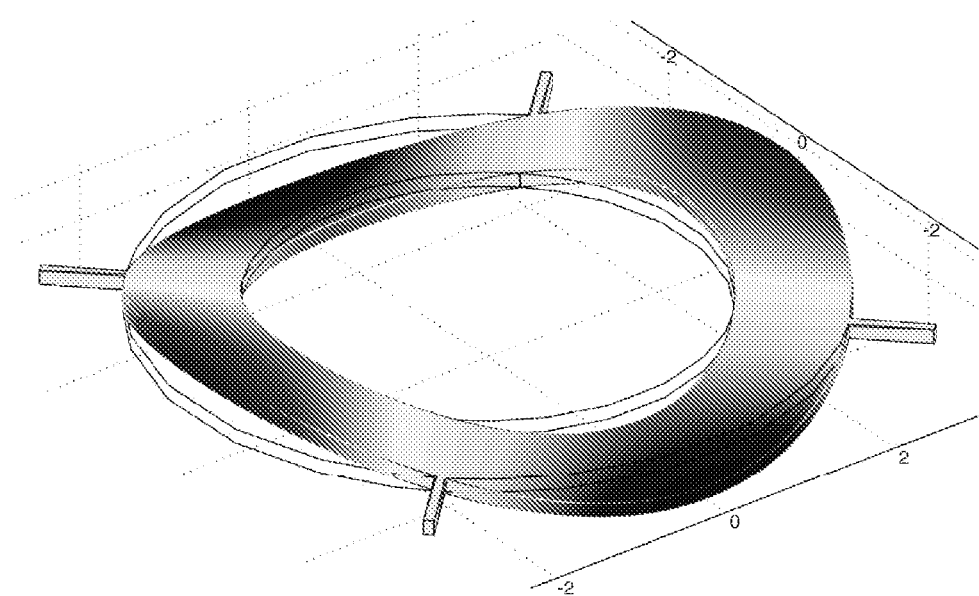
FIG. 16. An out-of-plane mode shape.

In the above embodiments the mode shapes are all in-plane modes. It is also possible to utilize out-of-plane modes, such as given in FIG. 16.

In this mode, the anchors are also at the quasi-nodal points. The segments between the anchors flex out-of-plane, alternatively upward and downward. To drive the structure, an electrode is positioned either above or under two opposite segments of the ring, see FIG. 17. A combination of DC and AC voltages is applied between this electrode and the structure to induce activation force. To sense the deformation, some areas with shallow doping are made.

Figure 17:
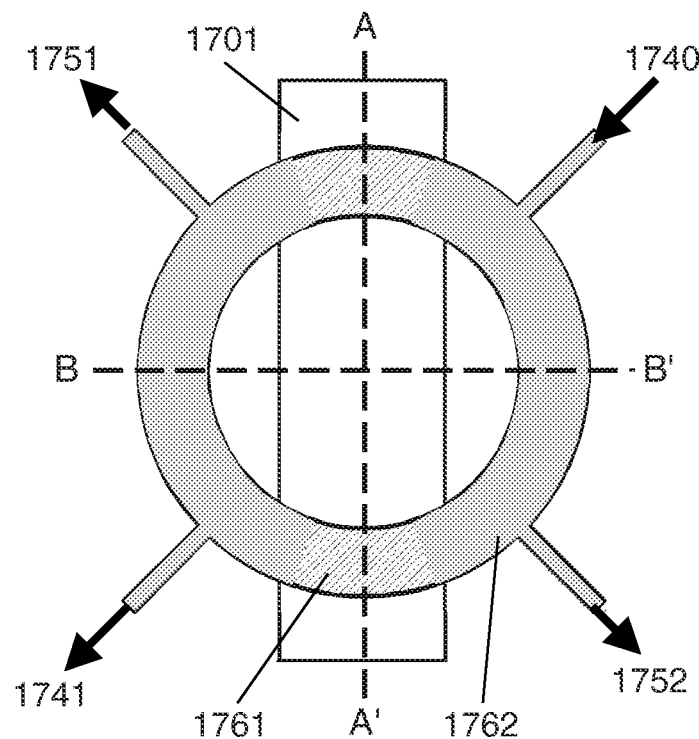
FIG. 17. Ring resonator using an out-of-plane vibration mode and shallow doping. The top drawing shows the top view and the lower drawings show the cross-section views along AA' and BB'.
Figure 17:
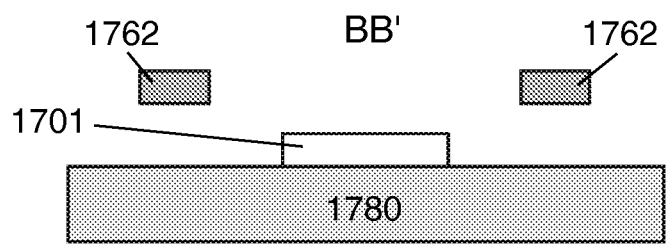
Figure 17:
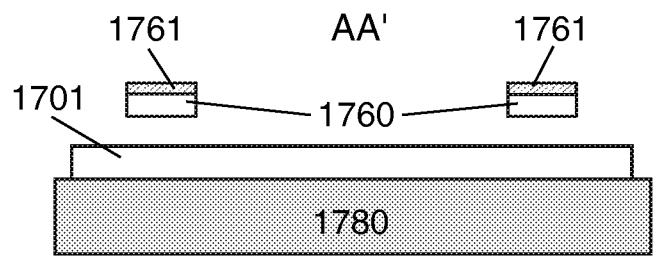

In FIG. 17, an example is given where the two shallowly doped areas (1761) are created at the two segments that face the electrode. The doped regions can be made very shallow, e.g. in the order of 100 nm or less on the top surface of the Si structure. Close to the structure (top or bottom) surface, the maximum strain can be obtained when the structure flexes out-of-plane. Due to the shallow dope profile, the distance s in (9) can be large, thus higher a can be achieved. The rest of the ring area is fully doped (e.g. well-doped) with a high concentration to create electrical connection. A sense current, splitting into two paths, flows through the two shallowly doped regions in order to detect of the out-of-plane deformation during vibration. Reference signs have the same meaning as above.

Figure 18A:
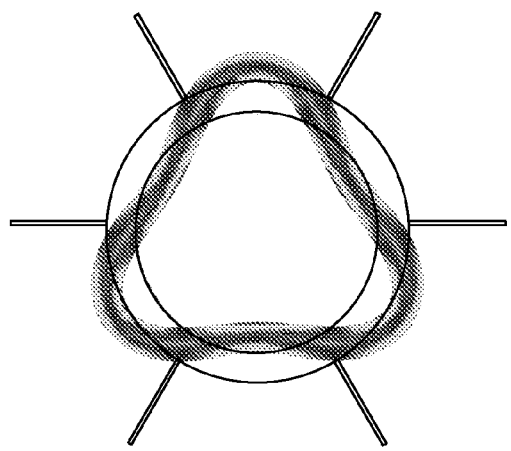
FIG. 18a. structure having a mode shape with 6 quasi-nodal points/segments.
Figure 18B:
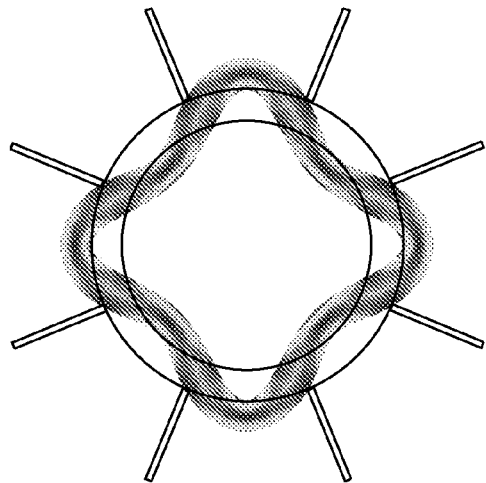
FIG. 18b. structure having a mode shape with 8 quasi-nodal points/segments.
Figure 18C:
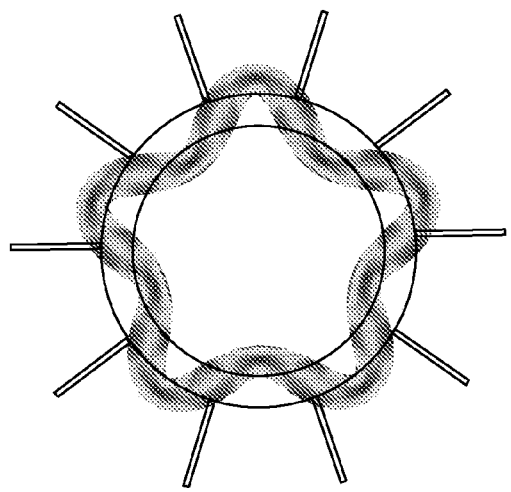
FIG. 18c. structure having a mode shape with 10 quasi-nodal points/segments.

The ring can further be excited in mode shapes that have an even number of quasi-nodal points (even number of segments). Anchors can be positions at all quasi-nodal points or some of the quasi-modal points. See FIGS. 18 *a-c*.

The invention claimed is:

1. MEMS piezoresistive resonator, comprising:
   a single piece resonator having a frame shape chosen from the group consisting of:
      a circular hsape and a symmetrical polygonal shape
   at least two anchors, and
   at least one electrode for exciting the resonator,
   wherein a resistivity of a resonator material is at at least one first location relatively high and/or wherein the resistivity of resonator material is at at least one second location relatively low.

2. MEMS piezoresistive resonator according to claim 1, further comprising a plurality of symmetrically located anchor points.

3. MEMS piezoresistive resonator according to claim 1, wherein the resonator includes a material that is locally N- and/or P-type doped.

4. MEMS piezoresistive resonator according to claim 1, which resonator is divided by a plurality of anchor points into n symmetrical elements, wherein n is an even integer.

5. MEMS piezoresistive resonator according to claim 1, wherein in a vicinity of an anchor point the resistivity of the resonator material is locally relatively low and/or wherein in a first area between a plurality of anchor points the resistivity of resonator material is relatively high and/or wherein in a second area between a plurality of anchor points the resonator material is piezoresistive.

6. Device comprising a MEMS piezoresistive resonator according to claim 1.

7. MEMS piezoresistive resonator according to claim 1, wherein the resonator is a silicon resonator.

8. MEMS piezoresistive resonator according to claim 1, wherein the resonator has a form of a frame which has a shape that is one of circular, square, rectangular, hexagonal, octagonal, and decagonal.

9. Method of operating a MEMS piezoresistive resonator having a single piece resonator with a frame shape chosen from the group consisting of a circular shape and a symmetrical polygonal shape; and having at least two anchors, and at least one electrode for exciting the resonator, a resistivity of a resonator material at at least one first location being relatively high and/or the resistivity of the resonator material at at least one second location being relatively low, comprising:
   applying a combination of AC and DC excitation voltages, sending an electrical input current through the frame, and sensing a resistance change within the frame.

10. Method according to claim 9, wherein the resonator is operated to vibrate in a flexural mode shape.

11. Method according to claim 9, whereby alternating segments of the resonator contract and extend at a certain point in time during operation.

12. Method of minimizing vibration energy loss by operating a resonator according to claim 9.

* * * * *